US011355321B2

(12) United States Patent
Collins et al.

(10) Patent No.: US 11,355,321 B2
(45) Date of Patent: Jun. 7, 2022

(54) PLASMA REACTOR WITH ELECTRODE ASSEMBLY FOR MOVING SUBSTRATE

(71) Applicant: Applied Materials, Inc., Santa Clara, CA (US)

(72) Inventors: Kenneth S. Collins, San Jose, CA (US); Michael R. Rice, Pleasanton, CA (US); Kartik Ramaswamy, San Jose, CA (US); James D. Carducci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 738 days.

(21) Appl. No.: 15/630,828

(22) Filed: Jun. 22, 2017

(65) Prior Publication Data

US 2018/0374686 A1    Dec. 27, 2018

(51) Int. Cl.
*H01J 37/32* (2006.01)
*C23C 16/458* (2006.01)
(Continued)

(52) U.S. Cl.
CPC ...... *H01J 37/32577* (2013.01); *C23C 16/458* (2013.01); *C23C 16/4584* (2013.01);
(Continued)

(58) Field of Classification Search
CPC ............ H01J 37/32577; H01J 37/3211; H05H 2001/466; H05H 2001/486;
(Continued)

(56) References Cited

U.S. PATENT DOCUMENTS 4,765,179 A    8/1988 Fuller et al.
4,825,467 A    4/1989 Rist et al.
(Continued)

FOREIGN PATENT DOCUMENTS

CN    1261927    8/2000
CN    105051866    11/2015
(Continued)

OTHER PUBLICATIONS

Anders, "Plasma and Ion Sources in Large Area Coatings: A Review," The International Conference on Metallurgical Coatings and Thin Films (ICMCTF), Feb. 2005, 42 pages.
(Continued)

*Primary Examiner* — Aiden Lee
(74) *Attorney, Agent, or Firm* — Fish & Richardson P.C.

(57) ABSTRACT

A processing tool for a plasma process includes a chamber body that has an interior space that provides a plasma chamber and that has a ceiling and an opening on a side opposite the ceiling, a workpiece support to hold a workpiece such that at least a portion of a front surface of the workpiece faces the opening, an actuator to generate relative motion between the chamber body and the workpiece support such that the opening moves laterally across the workpiece, a gas distributor to deliver a processing gas to the plasma chamber, an electrode assembly comprising a plurality of coplanar filaments extending laterally through the plasma chamber between the workpiece support and the ceiling, each of the plurality of filaments including a conductor, and a first RF power source to supply a first RF power to the conductors of the electrode assembly to form a plasma.

15 Claims, 9 Drawing Sheets

(51) Int. Cl.
  *C23C 16/54* (2006.01)
  *C23C 16/509* (2006.01)
  *C23C 16/455* (2006.01)

(52) U.S. Cl.
  CPC .. *C23C 16/45519* (2013.01); *C23C 16/45536* (2013.01); *C23C 16/45551* (2013.01); *C23C 16/45563* (2013.01); *C23C 16/509* (2013.01); *C23C 16/545* (2013.01); *H01J 37/32082* (2013.01); *H01J 37/32449* (2013.01); *H01J 37/32706* (2013.01); *H01J 37/32715* (2013.01)

(58) Field of Classification Search
  CPC ............ H05H 2001/488; C23C 16/509; C23C 16/45551; C23C 16/4584
  See application file for complete search history.

(56) References Cited

U.S. PATENT DOCUMENTS

| | | | |
|---|---|---|---|
| 4,903,297 | A | 2/1990 | Rist et al. |
| 5,522,934 | A | 6/1996 | Suzuki et al. |
| 5,556,501 | A * | 9/1996 | Collins ................. C23C 16/509 156/345.38 |
| 6,054,013 | A | 4/2000 | Collins et al. |
| 6,161,499 | A * | 12/2000 | Sun .......................... C23C 16/02 118/723 E |
| 6,164,241 | A | 12/2000 | Chen et al. |
| 6,313,430 | B1 | 11/2001 | Fujioka et al. |
| 6,353,201 | B1 | 3/2002 | Yamakoshi et al. |
| 6,444,085 | B1 | 9/2002 | Collins et al. |
| 6,456,010 | B2 | 9/2002 | Yamakoshi et al. |
| 6,503,816 | B2 | 1/2003 | Ito et al. |
| 7,001,831 | B2 | 2/2006 | Niira et al. |
| 7,205,034 | B2 | 4/2007 | Kawamura et al. |
| 7,833,587 | B2 | 11/2010 | Mashima et al. |
| 7,868,517 | B2 | 1/2011 | Belot et al. |
| 8,081,049 | B2 | 12/2011 | Yoshida |
| 8,129,912 | B2 | 3/2012 | Ko et al. |
| 8,607,733 | B2 | 12/2013 | Tachibana |
| 8,914,166 | B2 | 12/2014 | He |
| 9,165,748 | B2 | 10/2015 | Takagi et al. |
| 9,355,821 | B2 | 5/2016 | Chen et al. |
| 9,396,900 | B2 | 6/2016 | Lane et al. |
| 9,419,583 | B2 | 8/2016 | Rinaldi et al. |
| 9,431,217 | B2 | 8/2016 | Mai et al. |
| 9,554,738 | B1 | 1/2017 | Gulati et al. |
| 2004/0052972 | A1 * | 3/2004 | Schmitt ............... C23C 16/4412 427/569 |
| 2004/0060662 | A1 | 4/2004 | Yeom et al. |
| 2005/0067934 | A1 | 3/2005 | Ueda et al. |
| 2007/0012250 | A1 * | 1/2007 | Yeom .................... H01J 37/321 118/723 AN |
| 2009/0001290 | A1 * | 1/2009 | Yamashita ............... H01J 27/14 250/492.3 |
| 2010/0239757 | A1 | 9/2010 | Murata |
| 2011/0008550 | A1 | 1/2011 | Murata et al. |
| 2012/0247390 | A1 | 10/2012 | Sawada et al. |
| 2013/0105086 | A1 | 5/2013 | Banna et al. |
| 2013/0221833 | A1 | 8/2013 | Kudela et al. |
| 2014/0057447 | A1 | 2/2014 | Yang et al. |
| 2014/0238608 | A1 | 8/2014 | Sabri et al. |
| 2015/0048739 | A1 * | 2/2015 | Forster .............. H01J 37/32513 315/111.21 |
| 2015/0075719 | A1 | 3/2015 | Ramaswamy et al. |
| 2016/0024653 | A1 * | 1/2016 | Forster .............. C23C 16/45536 427/569 |
| 2016/0254124 | A1 | 9/2016 | Bera |
| 2017/0076917 | A1 | 3/2017 | Yudovsky et al. |

FOREIGN PATENT DOCUMENTS

| | | |
|---|---|---|
| CN | 105474362 | 4/2016 |
| CN | 105706213 | 6/2016 |
| JP | 06-061153 | 3/1994 |

OTHER PUBLICATIONS

Chang et al., "Generating large-area uniform microwave field for plasma excitation," Physics of Plasmas, 2012, 19, 6 pages.
Chen et al., "Generation of uniform large-area very high frequency plasmas by launching two specific standing waves simultaneously," Journal of Applied Physics, 2014, 116, 9 pages.
Chen et al., "Generation of Uniform Large-Area VHF Plasmas by Launching a Traveling Wave," Plasma Processes and Polymers, Jan. 2014, 11(1): 7-11.
Cober Electronics, Inc., "Plasmaline Large Area Plasma Systems," Stan Whitehair, 21 pages.
Goya et al., "Development of Amorphous Silicon/Microcrystalline Silicon Tandem Solar Cells," $3^{rd}$ World Conference on Photovoltaic Energy Conversion, Osaka, Japan, May 11-18, 2003, 1570-1573.
He and Hall, "Longitudinal voltage distribution in transverse rf discharge waveguide lasers," J. Appl. Phys., Aug. 1983, 54(8): 4367-4373.
Hohenstein et al., "Resonant RF network antennas for large-area and large-volume inductively coupled plasma sources," Plasma Sources Sci. Technol., 2013, 22: 1-10.
Hwang et al., "Dual comb-type electrodes as a plasma source for very high frequency plasma enhanced chemical vapor deposition," Thin Solid Films, 2010, 518: 2124-2127.
Ito et al., "Large Area Deposition of Hydrogenated Amorphous Silicon by VHF-PECVD Using Novel Electrodes," IEEE, 900-903.
Livesay, "Large-area electron-beam source," J. Vac. Sci. Technol., Nov. 1993, 11(6): 2304-2308.
Mashima et al., "Characteristics of Very High Frequency Plasma Produced Using a Ladder-Shaped Electrode," Jpn. J. Appl. Phys., 1999, 38: 4305-4308.
Mashima et al., "Large area VHF plasma production using a ladder-shaped electrode," Thin Solid Films, 2006, 512-516.
Meiling et al., "Film Uniformity and Substrate-To-Electrode Attachment in Large-Area VHF Glow-Discharge Deposition of a-Si:H," $25^{th}$ PVSC, May 1996, 1153-1156.
Morrison et al., "Deposition of Microcry stalline Silicon Films and Solar Cells via the Pulsed PECVD Technique," IEEE, 1102-1105.
Noda et al., "Large Area Thin Film Si Tandem Module Production Using VHF Plasma with a Ladder-Shaped Electrode," $3^{rd}$ World Conference on Photovoltaic Energy Conversion, May 11-18, 2003, Osaka, Japan, 1849-1851.
Satake et al., "Experimental and numerical studies on voltage distribution in capacitively coupled very high-frequency plasmas," Plasma Sources Sci. Technol., 2004, 13: 436-445.
Sato et al., "Design of Folded Monopole Array Antenna Used for Large Area Plasma Production," IEEE, 2004, 1026-1029.
Schmidt et al., "Improving plasma uniformity using lens-shaped electrodes in a large area very high frequency reactor," Journal of Applied Physics, May 2004, 95(9): 4559-4564.
Schmidt, "Characterization of a High-Density, Large-Area VHF Plasma Source," Characterization of a High-Density, Large-Area VHF Plasma Source, 2006, 154 pages.
Stephan and Kuske, "Large Area Deposition Technique for PECVD of Amorphous Silicon," IEEE, 1997, 647-650.
Takagi et al., "Large Area Multi-Zone Type VHF-PCVD System for a-Si and µc-Si Deposition," $3^{rd}$ World Conference on Photovoltaic Energy Conversion, May 11-18, 2003, Osaka, Japan, 1792-1795.
Terasa et al., "PECVD of Doped and Intrinsic A-SI:H Layers for Solar Cell Structures Using A (Novel) Inline Deposition System," IEEE, 1528-1531.
Wu et al., "A traveling wave-driven, inductively coupled large area plasma source," Applied Physics Letters, Feb. 1998, 72(7): 777-779.
Wu et al., "The influence of antenna configuration and standing wave effects on density profile in a large-area inductive plasma source," Plasma Sources Sci. Technol., 2000, 9: 210-218.
Yamauchi et al., "Development of a-Si/Micro-crystalline-Si Tandem-type Photovoltaic Solar Cell," Technical Review, Oct. 2005, 42(3): 1-5.
Yamauchi et al., "High Efficiency Large Area Solar Module in Mitsubishi Heavy Industries," Technical Review, Oct. 2004, 41(5): 1-4.

(56) References Cited

OTHER PUBLICATIONS

Yu et al., "Linear Plasma Sources for Large Area Film Deposition: A Brief Review," Plasma Science and Technology, Apr. 2014, 16(4): 356-362.
Muegge, Microwave Plasma Processing, 2013, 12 pages.
International Search Report and Written Opinion in International Application No. PCT/US2018/038696, dated Oct. 26, 2018, 11 pages.
Office Action in Chinese Appln. No. 201880048120.5, dated Feb. 8, 2022, 11 pages (with English translation).

* cited by examiner

PLASMA REACTOR WITH ELECTRODE ASSEMBLY FOR MOVING SUBSTRATE

TECHNICAL FIELD

The present disclosure relates to a processing tool that includes a plasma reactor, e.g. for depositing a film on, etching, or treating a workpiece such as a semiconductor wafer.

BACKGROUND

Plasma is typically generated using a capacitively-coupled plasma (CCP) source or an inductively-coupled plasma (ICP) source. A basic CCP source contains two metal electrodes separated by a small distance in a gaseous environment similar to a parallel plate capacitor. One of the two metal electrodes are driven by a radio frequency (RF) power supply at a fixed frequency while the other electrode is connected to an RF ground, generating an RF electric field between the two electrodes. The generated electric field ionizes the gas atoms, releasing electrons. The electrons in the gas are accelerated by the RF electric field and ionizes the gas directly or indirectly by collisions, producing plasma.

A basic ICP source typically contains a conductor in a spiral or a coil shape. When an RF electric current is flowed through the conductor, RF magnetic field is formed around the conductor. The RF magnetic field accompanies an RF electric field, which ionizes the gas atoms and produces plasma.

Plasmas of various process gasses are widely used in fabrication of integrated circuits. Plasmas can be used, for example, in thin film deposition, etching, and surface treatment.

Atomic layer deposition (ALD) is a thin film deposition technique based on the sequential use of a gas phase chemical process. Some ALD processes use plasmas to provide necessary activation energy for chemical reactions. Plasma-enhanced ALD processes can be performed at a lower temperature than non-plasma-enhanced (e.g., 'thermal') ALD processes.

SUMMARY

In one aspect, a processing tool for a plasma process includes a chamber body that has an interior space that provides a plasma chamber and that has a ceiling and an opening on a side opposite the ceiling, a workpiece support to hold a workpiece such that at least a portion of a front surface of the workpiece faces the opening, an actuator to generate relative motion between the chamber body and the workpiece support such that the opening moves laterally across the workpiece, a gas distributor to deliver a processing gas to the plasma chamber, an electrode assembly comprising a plurality of coplanar filaments extending laterally through the plasma chamber between the workpiece support and the ceiling, each of the plurality of filaments including a conductor, and a first RF power source to supply a first RF power to the conductors of the electrode assembly to form a plasma.

Implementations may include one or more of the following features.

The workpiece support may be rotatable about an axis of rotation, and the actuator may rotate the workpiece support such that rotation of the support carries the workpiece across the opening.

The plurality of coplanar filaments may extend across a wedge-shaped area. The workpiece may fit entirely within the wedge-shaped area such that in operation an entirety of the front surface of the workpiece is exposed to plasma. The workpiece may be larger than the wedge-shaped area such that in operation a wedge-shaped portion of the front surface of the workpiece is exposed to plasma. The opening may be wedge-shaped.

The plurality of coplanar filaments comprise linear filaments, and different filaments may have different lengths so as to define the wedge-shaped area. The plurality of coplanar filaments may extend in parallel. The plurality of coplanar filaments may be uniformly spaced apart. Different filaments may be oriented at different angles. The plurality of coplanar filaments are oriented such that a plasma density generated in the wedge-shaped area is lower at an apex of the wedge-shaped area than at a base of the wedge-shaped area. The plurality of coplanar filaments may be oriented to have longitudinal axes at a non-zero angle relative to a direction of motion of the portion of the substrate below the opening. The non-zero angle is greater than 10°.

A spacing between the coplanar filaments is sufficient to avoid pinching of a plasma region between regions above and below the intra-chamber electrode assembly. A bottom of the chamber is open. The tool may include a top electrode on the ceiling of the chamber.

Ends of conductors of the plurality of coplanar filaments may be connected to the first RF power source by a recursive RF feed structure. Opposite ends of conductors of the plurality of coplanar filaments may be connected to a common bus. The bus may be connected to the first RF power source at two opposing locations.

A first multiplicity of conductors of the plurality of coplanar filaments are connected to the first RF power source and a second multiplicity of conductors of the plurality of coplanar filaments are floating or grounded. First ends of conductors of the plurality of coplanar filaments may be connected to the first RF power source by a common bus. The conductors of the first group and the conductors of the second group may be arranged to alternate along a direction perpendicular to a longitudinal axis of the filaments Certain implementations may have one or more of the following advantages. Plasma uniformity may be improved. Plasma process repeatability may be improved. Metal contamination may be reduced. Particle generation may be reduced. Plasma charging damage may be reduced. Uniformity of plasma may be maintained over different process operating conditions. Plasma power coupling efficiency may be improved. Plasma region size may be reduced for a given size of a workpiece. Plasma process throughput may be improved. The workpiece may be carried through multiple chambers in succession while remaining on a support. Effects of relative velocity during exposure to plasma may be compensated, and thus within-wafer uniformity may be improved. Low impedance RF ground may be provided.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

Figure 1:
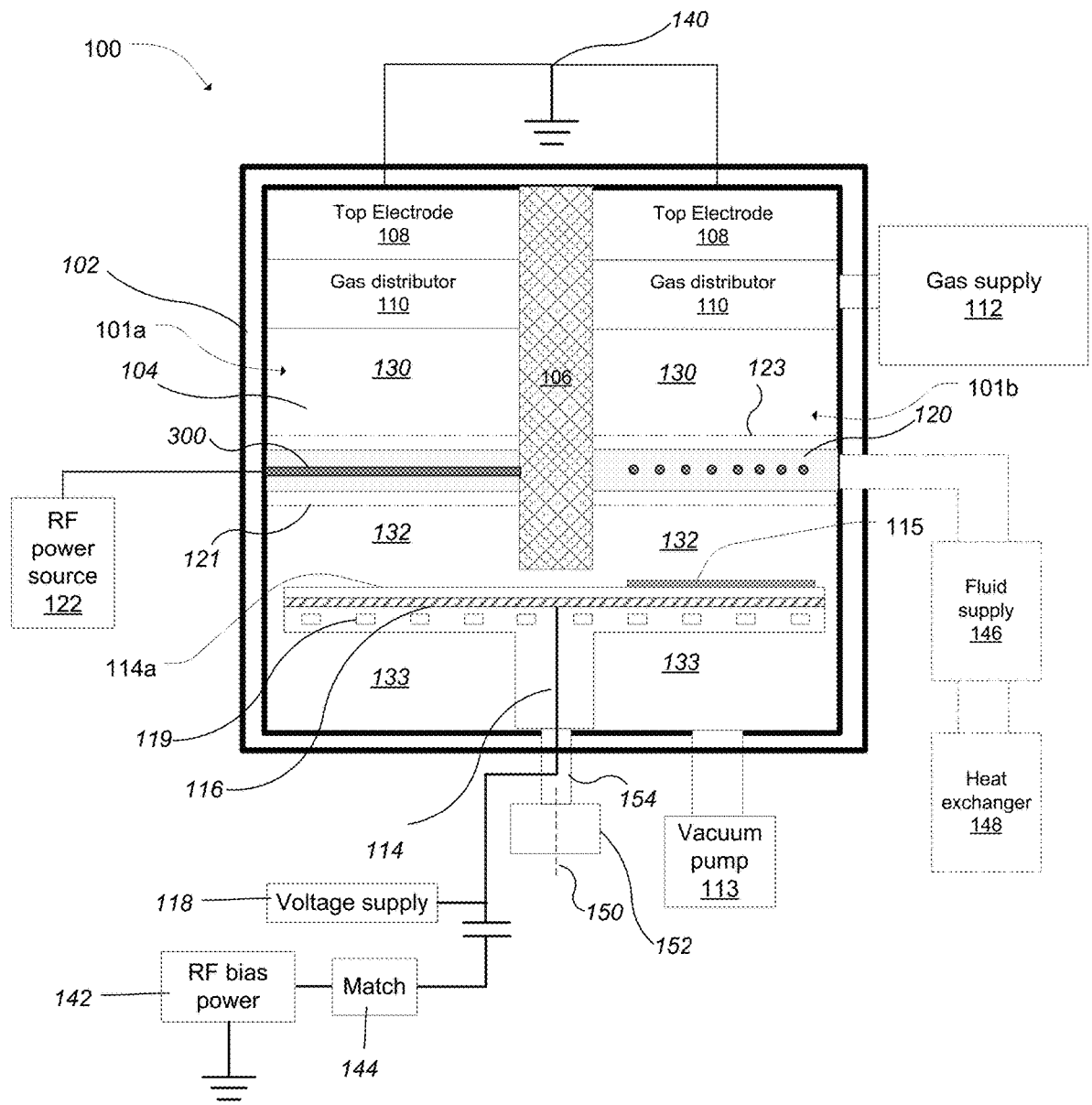
FIG. 1 is a schematic side view diagram of an example of a processing tool that includes a plasma chamber.

In a conventional plasma reactor, a workpiece remains stationary within the reactor chamber. A plasma region is generated above the stationary workpiece, which then treats the workpiece surface. However, some plasma processing applications can benefit from having the workpiece move through a plasma region, i.e., a relative motion between the plasma region and the workpiece. In addition, for some tools the substrate is moved between different chambers for a sequence of processing steps.

One way of achieving relative motion between the workpiece and the plasma region is by placing the workpiece on a workpiece support that moves along a linear path, e.g., a conveyor belt. In such a configuration, the workpiece may make a single pass in one direction through the plasma region and exit the other side of the chamber. This may be advantageous for some sequential processes in which workpiece travels through multiple chambers of different types as part of a fabrication process.

Another way of achieving relative motion between the workpiece and the plasma region is by placing the workpiece on a rotating workpiece support. Rotating workpiece support enables multiple passes through the plasma region without changing the direction of travel, which can improve throughput as the workpiece support does not need to continuously change its direction of travel. However, if the support is rotating, then different regions of the workpiece may be moving at different velocities relative to the region plasma.

Plasma uniformity in a conventional CCP source is typically determined by electrode(s) size and inter-electrode distance, as well as by gas pressure, gas composition, and applied RF power. At higher radio frequencies, additional effects may become significant or even dominate non-uniformities due to the presence of standing waves or skin effects. Such additional effects becomes more pronounced at higher frequencies and plasma densities.

Plasma uniformity in a conventional ICP source is typically determined by the configuration of ICP coil(s) including its size, geometry, distance to workpiece, and associated RF window location, as well as by gas pressure, gas composition, and power. In case of multiple coils or coil segments, the current or power distribution and their relative phase, if driven at same frequency, might also be a significant factor. Power deposition tends to occur within several centimeters under or adjacent to ICP coils due to skin effect, and such localized power deposition typically leads to process non-uniformities that reflect the coil geometries. Such plasma non-uniformity causes a potential difference across a workpiece, which can also lead to plasma charging damage (e.g., transistor gate dielectric rupture).

A large diffusion distance is typically needed for improved uniformity of ICP source. However, a conventional ICP source with a thick RF window is typically inefficient at high gas pressures due to low power coupling, which leads to high drive current resulting in high resistive power losses. In contrast, an intra-chamber electrode assembly does not need to have an RF window, but only a cylindrical shell. This can provide better power coupling and better efficiency.

In a plasma chamber with a moving workpiece support, the moving workpiece support may be DC grounded through, for example, a rotary mercury coupler, brushes, or slip rings. However, the moving workpiece support may not be adequately grounded at radio frequencies. The RF ground path should have substantially lower impedance than the plasma for it to be an adequate RF ground. The lack of an adequate RF ground path may make it difficult to control ion energy at the workpiece and reduce the repeatability of the process.

A plasma source with the following properties is thus desired: it can efficiently produce a uniform plasma with the desired properties (plasma density, electron temperature, ion energy, dissociation, etc.) over the workpiece size; it is tunable for uniformity over the operating window (e.g. pressure, power, gas composition); it has stable and repeatable electrical performance even with a moving workpiece; and it does not generate excessive metal contaminants or particles. An intra-chamber electrode assembly might be better able to provide one or more of these properties.

FIG. 1 is a schematic side view diagram of an example of a processing tool. A processing tool 100 has a chamber body 102 enclosing an interior space 104. The interior space 104 can be cylindrical, e.g., to contain a circular workpiece support. At least some of the interior space is used as a plasma chamber or a plasma reactor. The chamber body 102 has a support 106 for providing mechanical support for various components within the interior space 104. For example, the support 106 can provide support for a top electrode 108. The top electrode can be suspended within the interior space 104 and spaced from the ceiling, abut the ceiling, or form a portion of the ceiling. Some portions of the side walls of the chamber body 102 can be grounded independent of the top electrode 108.

A gas distributor 110 is located near the ceiling of the plasma reactor portion of the processing tool 100. In some implementations, the gas distributor 110 is integrated with the top electrode 108 as a single component. The gas distributor 110 is connected to a gas supply 112. The gas supply 112 delivers one or more process gases to the gas distributor 110, the composition of which can depend on the process to be performed, e.g., deposition or etching.

A vacuum pump 113 is coupled to the interior space 104 to evacuate the processing tool. For some processes, the chamber is operated in the Torr range, and the gas distributor 110 supplies argon, nitrogen, oxygen and/or other gases.

A workpiece support 114 for supporting a workpiece 115 is positioned in the processing tool 100. The workpiece support 114 has a workpiece support surface 114a facing the ceiling of the processing tool 100. For example, the workpiece support surface 114a can face the top electrode 108. The workpiece support 114 is operable to rotate about an axis 150. For example, an actuator 152 can turn a drive shaft 154 to rotate the workpiece support 114. In some implementations, the axis 150 is coincident with the center of the workpiece support 114.

In some implementations, the workpiece support 114 includes a workpiece support electrode 116 inside the workpiece support 114. In some implementations, the workpiece support electrode 116 may be grounded or connected to an impedance or circuit which is grounded. In some implementations, an RF bias power generator 142 is coupled through an impedance match 144 to the workpiece support electrode 116. The workpiece support electrode 116 may additionally include an electrostatic chuck, and a workpiece bias voltage supply 118 may be connected to the workpiece support electrode 116. The RF bias power generator 142 may be used to generate plasma, control electrode voltage or electrode sheath voltage, or to control ion energy of the plasma.

Additionally, the workpiece support 114 can have internal passages 119 for heating or cooling the workpiece 115. In some implementations, an embedded resistive heater can be provided inside the internal passages 119.

In some implementations, the workpiece support 114 is heated through radiation, convection, or conduction from a heating element located within a bottom interior space 133.

An intra-chamber electrode assembly 120 is positioned in the interior space 104 between the top electrode 108 and the workpiece support 114. This electrode assembly 120 includes one or more coplanar filaments 300 that extend laterally in the chamber over the support surface 114a of the workpiece support 114. At least a portion of the coplanar filaments of the electrode assembly 120 over the workpiece support 114 extends parallel to the support surface 114a. Although the left side of FIG. 1 illustrates filaments 300 as parallel to the direction of motion of the workpiece 115 (into and out of the page), the filaments 300 can be at a non-zero angle relative to direction of motion, e.g., substantially perpendicular to direction of motion.

A top gap 130 is formed between the top electrode 108 and the intra-chamber electrode assembly 120. A bottom gap 132 is formed between the workpiece support 114 and the intra-chamber electrode assembly 120.

The interior space 104 can be segmented into one or more zones 101a, 101b by barriers, at least one of which serves as the plasma chamber. The barriers define one or more openings 123 above the workpiece support. In some implementations, the electrode assembly 120 is positioned inside the opening 123. In some implementations, the electrode assembly is placed above the opening 123. In some implementations, the barriers are integrally formed by the support 106, and the openings 123 are formed on the support 106. In some implementations, the opening 123 formed on the support 106 is configured to support the electrode assembly 120.

The electrode assembly 120 is driven by an RF power source 122. The RF power source 122 can apply power to the one or more coplanar filaments of the electrode assembly 120 at frequencies of 1 MHz to over 300 MHz. For some processes, the RF power source 120 provides a total RF power of 100 W to more than 2 kW at a frequency of 60 MHz.

In some implementations, it may be desirable to select the bottom gap 132 to cause plasma generated radicals, ions or electrons to interact with the workpiece surface. The selection of gap is application-dependent and operating regime dependent. For some applications wherein it is desired to deliver a radical flux (but very low ion/electron flux) to the workpiece surface, operation at larger gap and/or higher pressure may be selected. For other applications wherein it is desired to deliver a radical flux and substantial plasma ion/electron flux) to the workpiece surface, operation at smaller gap and/or lower pressure may be selected. For example, in some low-temperature plasma-enhanced ALD processes, free radicals of process gases are necessary for the deposition or treatment of an ALD film. A free radical is an atom, a molecule, or an ion that has an unpaired valence electron. A free radical is typically highly chemically reactive towards other substances. The reaction of free radicals with other chemical species often plays an important role in film deposition. However, free radicals are typically short-lived due to their high chemical reactivity, and therefore cannot be transported very far within their lifetime. Placing the source of free radicals, namely the intra-chamber electrode assembly 120 acting as a plasma source, close to the surface of the workpiece 115 can increase the supply of free radicals to the surface, improving the deposition process.

The lifetime of a free radical typically depends on the pressure of the surrounding environment. Therefore, a height of the bottom gap 132 that provides satisfactory free radical concentration can change depending on the expected chamber pressure during operation. In some implementations, if the chamber is to be operated at a pressure in the range of 1-10 Torr, the bottom gap 132 is less than 1 cm. In other low(er) temperature plasma-enhanced ALD processes, exposure to plasma ion flux (and accompanying electron flux) as well as radical flux may be necessary for deposition and treatment of an ALD film. In some implementations, if the chamber is to be operated at a pressure in the range of 1-10 Torr, the bottom gap 132 is less than 0.5 cm. Lower operating pressures may operate at larger gaps due to lower volume recombination rate with respect to distance. In other applications, such as etching, lower operating pressure is typically used (less than 100 mTorr) and gap may be increased.

In such applications where bottom gap 132 is small, the plasma generated by the electrode assembly 120 can have significant non-uniformities between the filaments, which may be detrimental to processing uniformity of the workpiece. By moving the workpiece through the plasma having spatial non-uniformities, the effect of the plasma spatial non-uniformities on the process can be mitigated by a time-averaging effect, i.e., the cumulative plasma dose received by any given region of the workpiece after a single pass through the plasma is substantially similar.

The top gap may be selected large enough for plasma to develop between intra-chamber electrode assembly and top electrode (or top of chamber). In some implementations, if the chamber is to be operated at a pressure in the range of 1-10 Torr, the top gap 130 may be between 0.5-2 cm, e.g., 1.25 cm.

The top electrode 108 can be configured in various ways. In some implementations, the top electrode is connected to an RF ground 140. In some implementations, the top electrode is electrically isolated ('floating'). In some implementations, the top electrode 108 is biased to a bias voltage. The bias voltage can be used to control characteristics of the generated plasma, including the ion energy. In some implementations, the top electrode 108 is driven with an RF signal. For example, driving the top electrode 108 with respect to the workpiece support electrode 116 that has been grounded can increase the plasma potential at the workpiece 115. The increased plasma potential can cause an increase in ion energy to a desired value.

The top electrode 108 can be formed of different process-compatible materials. Various criteria for process-computability include a material's resistance to etching by the process gasses and resistance to sputtering from ion bombardment. Furthermore, in cases where a material does get etched, a process-compatible material preferably forms a volatile, or gaseous, compound which can be evacuated by the vacuum pump 113, and not form particles that can contaminate the workpiece 115. Accordingly, in some implementations, the top electrode is made of silicon. In some implementations, the top electrode is made of silicon carbide.

In some implementations, the top electrode 108 may be omitted. In such implementations, RF ground paths may be provided by the workpiece support electrode, a subset of coplanar filaments of the electrode assembly 120, or by a chamber wall or other ground-referenced surfaces in communication with plasma.

In some implementations, a fluid supply 146 circulates a fluid through channels in the intra-chamber electrode assembly 120. In some implementations, a heat exchanger 148 is coupled to the fluid supply 146 to remove or supply heat to the fluid.

Depending on chamber configuration and supplied processing gasses, the plasma reactor in the processing tool 100 could provide an ALD apparatus, an etching apparatus, a plasma treatment apparatus, a plasma-enhanced chemical vapor deposition apparatus, a plasma doping apparatus, or a plasma surface cleaning apparatus.

Figure 2A:
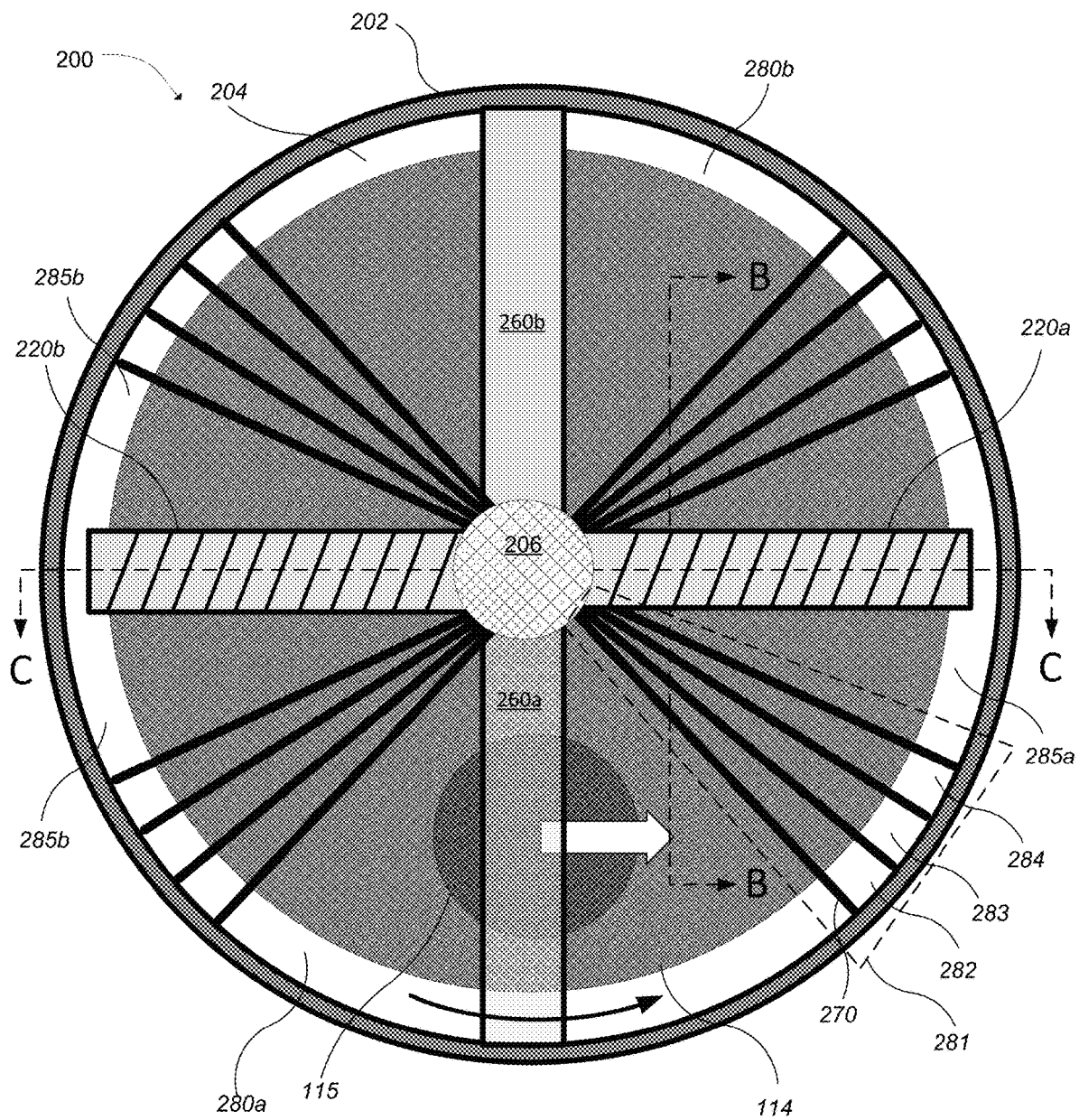
FIG. 2A is a schematic top view diagram of an example of a processing tool that includes a plasma chamber.

FIG. 2A is a schematic top view diagram of an example of a processing tool 200. The processing tool 200 is similar to the processing tool 100 except as described. The processing tool 200 has a cylindrical chamber body 202, an interior space 204 having a cylindrical shape, a support 206, electrode assemblies 220, and precursor stations 260. The support 206 is located at the center of the processing tool 200, and multiple radial partitions 270 are formed to partition the interior space 204 into multiple processing zones. For example, the multiple processing zones can be configured to have a shaped of a wedge, e.g., a circular section or an equilateral triangle, either possibly cut off at the apex. Processing zones can be configured in various ways to achieve various functions necessary for operation of the processing tool 200.

A precursor processing zone is configured to treat the workpiece 115 with one or more precursors, e.g., for an ALD process. For example, a first precursor station 260a positioned within a precursor processing zone 280a can be configured to flow or pump a chemical precursor A, treating the workpiece 115 as the workpiece 115 moves under the precursor station 260a. Then, the precursor station 260a can treat the workpiece 115 with a chemical precursor B, preparing the surface of the workpiece 115, e.g., for an ALD film-forming plasma treatment of the surface.

In some implementations, the precursor processing zone 280 includes multiple subzones having respective precursor station 260 for respective chemical precursors. In some implementations, the subzones are sequentially arranged along a path of the workpiece 115. In some implementations, the movement of workpiece 115 is halted during a precursor surface treatment. In some implementations, the workpiece 115 moves continuously through the precursor processing zone 280.

A gas isolation zone 281 is configured to provide spatial isolation of respective processing environments of multiple processing zones, e.g., a first processing zone and a second processing zone. The gas isolation zone 281 can include a first pumping zone 282, a purging zone 283, and a second pumping zone 284, each separated by a respective radial partitions 270. In a conventional system, the isolation of processing environments may be provided by a gas-tight seal between the first and second processing zones. However, due to the rotating workpiece support 114, providing such seal may not be practical. Instead, a level of isolation sufficient for plasma processing applications, e.g., ALD, can be provided by inserting the gas isolation zone 281 between the first and the second processing zones.

Figure 2B:
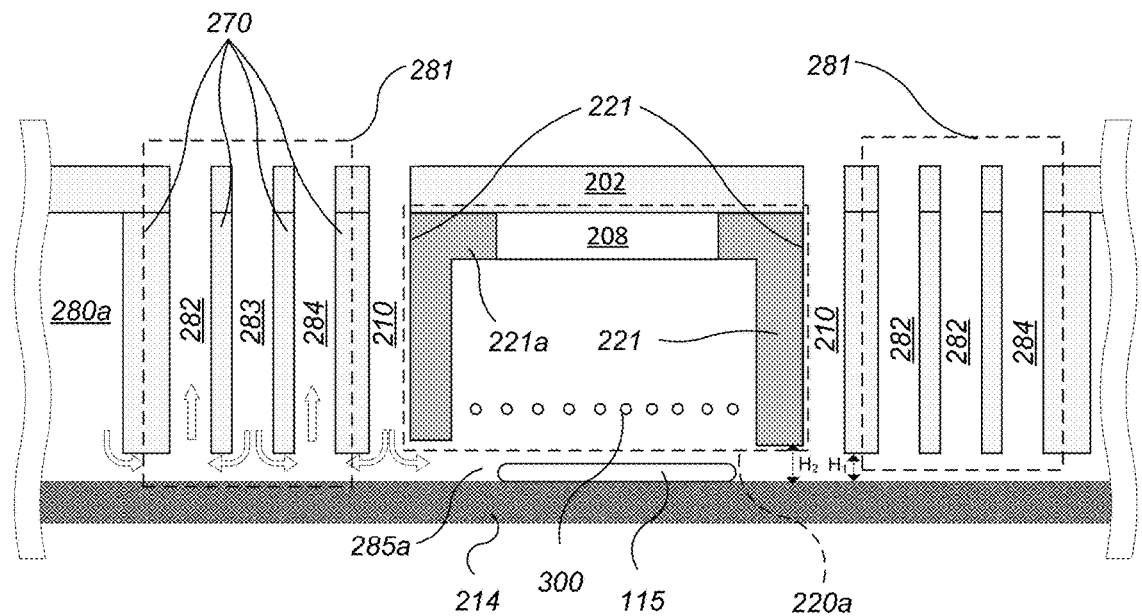
FIGS. 2B-2C are cross sectional side view diagrams of the processing tool of FIG. 2A along section lines B-B and C-C, respectively.

Referring to FIG. 2B, a cross sectional view of a portion of the processing tool 200 along a cross section line B is illustrated. During operation, the first pumping zone 282 adjacent to the first processing zone (e.g., precursor processing zone 280a) creates a negative pressure differential relative to the first processing zone. For example, the negative pressure differential can be generated using a vacuum pump. This negative pressure differential causes the process gasses leaking out of the first processing zone to be pumped out through the first pumping zone 282, as indicated by an arrow. Similarly, the second pumping zone 284 adjacent to the second processing zone provides a negative pressure differential relative to the second processing zone (e.g., plasma treatment zone 285a).

The purging zone 283 positioned between the first pumping zone 282 and the second pumping zone 284 supplies a purging gas. Examples of the purging gas include nonreactive gases such as argon and nitrogen. Due to the negative pressure differentials created by the first and second pumping zones, the purging gas supplied by the purging zone 283 is pumped into the first and second pumping zones, as indicated by the arrows. The presence of the purging gas can prevent the respective process gasses of the first and the second processing zones from mixing with one another, which may cause unwanted chemical reaction that results in unwanted deposition, etching, or debris generation.

A first gap height $H_1$ provides clearance between the radial partitions 270 and the workpiece support 114. The first gap height can be determined based on providing sufficient clearance for the workpiece 115 to pass through, while reducing process gas leakage into the pumping zones 282 and 284. For example, the first gap height can range from 2-4 mm, e.g., 3 mm.

Referring back to FIG. 2A, a plasma treatment zone 285 is configured to treat the workpiece 115 with plasma. For example, the electrode assembly 220a positioned within the plasma treatment zone 285a can generate plasma for treating the surface of the workpiece 115. The precursor-treated surface of the workpiece 115, which have moved through the gas isolation zone 281, is treated with the plasma generated by the electrode assembly 220a. In some implementations, the plasma treatment completes a deposition cycle of a single atomic layer of a first ALD film.

In some implementations, the electrode assembly 220 is formed in a rectangular shape as shown. In some implementations, the electrode assembly 220 is formed in a wedge shape.

Referring back to FIG. 2B, in some implementations, process gasses for the plasma treatment zone 285 is provided through gas inlets 210 formed adjacent to the electrode assembly 220. In particular, the gas inlet 210 can be provided at the edge of the gas isolation zone 281 adjacent the plasma processing region 285a. For example, a passage can be formed between one of the partitions 270 and an outer wall 221 of the electrode assembly 220a.

A second gap height H2 provides clearance between the electrode assembly 220 and the workpiece support 114. The second gap height can be determined based on providing sufficient clearance for the workpiece 115 to pass through and providing process gas to an interior region of the electrode assembly 220, while reducing process gas flow into the pumping zones 282 and 284. For example, the second gap height can range from 1-3 mm, e.g., 2 mm. In some implementations, the gas inlet is formed on the ingress side of the workpiece 115. In some implementations, the gas inlet is formed towards the radial outer edge of the electrode assembly, near the chamber wall 202. In some implementations, the gas inlet is formed towards the center of the workpiece support 114, e.g., near the axis 150.

In some implementations, a top electrode 208 is formed as a part of or supported by the electrode assembly 220a. For example, the top electrode 208 can be supported by a ceiling plate 221a.

Figure 2C:
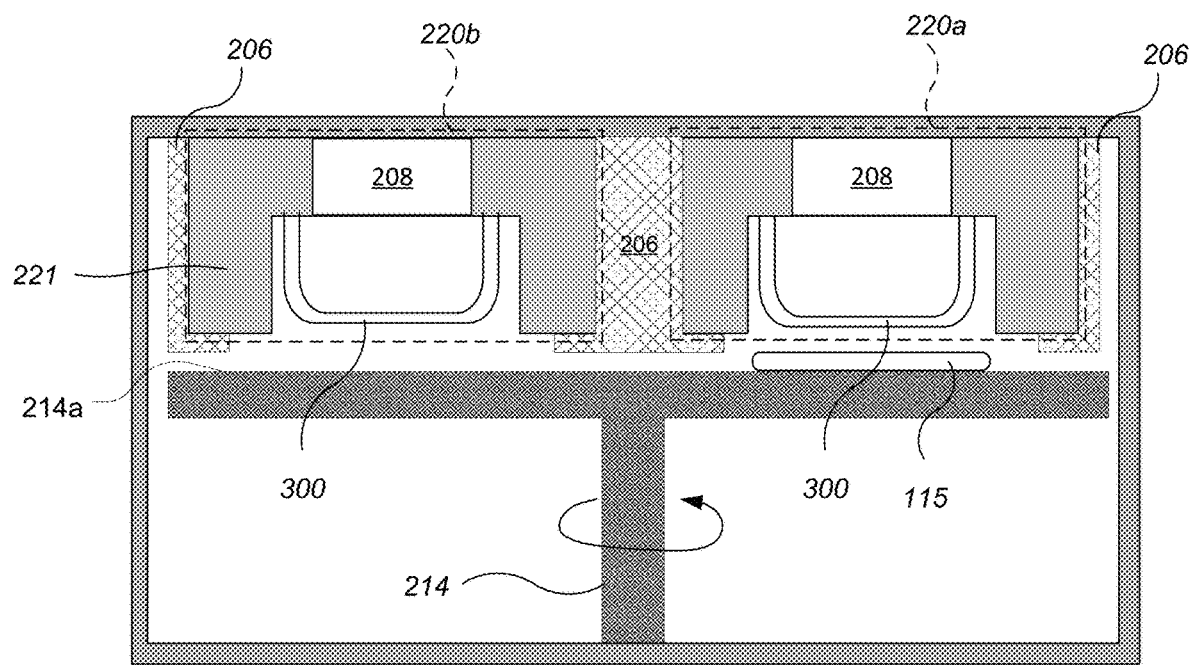

Referring to FIG. 2C, a cross sectional view of a portion of the processing tool 200 along a cross section line C is illustrated. In some implementations, the support 206 is configured to provide mechanical support for the electrode assemblies 220a and 220b as shown.

In some implementations, the processing tool 200 includes a second precursor processing zone 280b and a second plasma treatment zone 285b. The zones 280b and 285b can be configured to deposit a second ALD film. In some implementations, the second ALD film is the same as the first ALD film deposited by zones 280a and 285a. Such implementations may provide improved deposition speed of a single ALD film. In some implementations, the second ALD film is different from the first ALD. In such implementations, two different ALD films can be deposited in an alternating fashion. In general, the processing tool 200 can be configured to deposit 2, 3, 4, or more types of ALD films.

In general, the workpiece 115 may make a single pass or may make multiple passes through the processing zones. For example, direction of rotation may be alternated to make multiple pass through a specific processing zone.

In general, processing zones can be arranged in any sequence. For example, a precursor processing zone can be followed by 2 different plasma treatment zones having same or different plasma characteristics.

With respect to either FIG. 1 or FIGS. 2A-2C, the electrode assembly 120 or 220 includes one or more coplanar filaments 300 that extend laterally in the chamber over the support surface of the workpiece support. At least a portion of the coplanar filaments of the electrode assembly over the workpiece support extends parallel to the support surface. The filaments 300 can be at a non-zero angle relative to direction of motion, e.g., substantially perpendicular to direction of motion.

The electrode assembly can include side walls 221 that surround the electrode plasma chamber region. The side walls can be formed of a process-compatible material, e.g., quartz. In some implementations, the filaments project laterally out the side walls. In some implementations, the ends of the filaments 300 extend out of the ceiling of the electrode assembly and turn to provide the portion that is parallel to the support surface for the workpiece (see FIG. 2C).

Figure 3A:
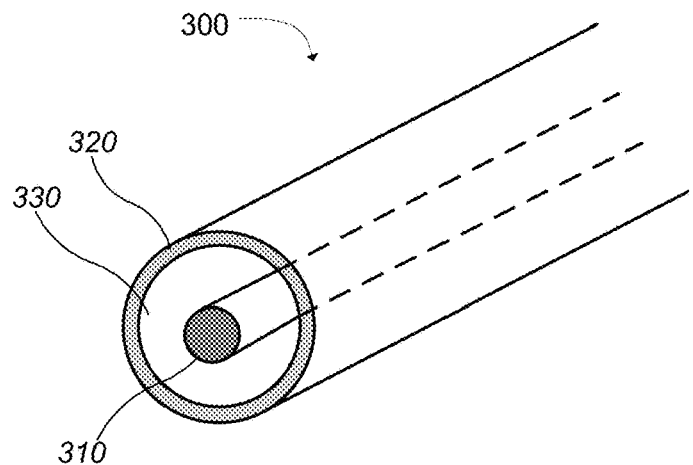
FIGS. 3A-3C are schematic cross-sectional perspective view diagrams of various examples of a filament of an intra-chamber electrode assembly.
Figure 3B:
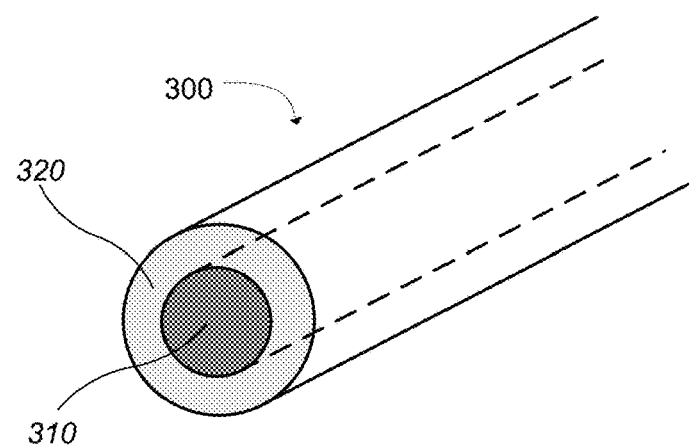
Figure 3C:
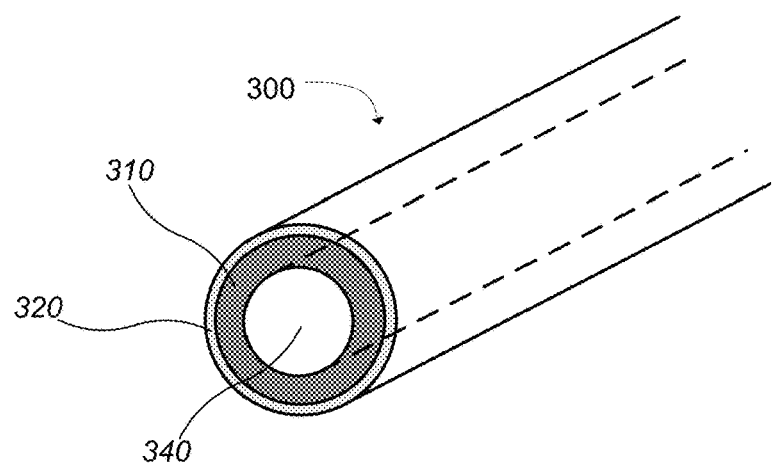

FIGS. 3A-C are schematic diagrams of various examples of a filament of an intra-chamber electrode assembly. Referring to FIG. 3A, a filament 300 of the intra-chamber electrode assembly 120 is shown. The filament 300 includes a conductor 310 and a cylindrical shell 320 that surrounds and extends along the conductor 310. A channel 330 is formed by the gap between the conductor 310 and the cylindrical shell 320. The cylindrical shell 320 is formed of a non-metallic material that is compatible with the process. In some implementations, the cylindrical shell is semiconductive. In some implementations, the cylindrical shell is insulative.

The conductor 310 can be formed of various materials. In some implementations, the conductor 310 is a solid wire, e.g., a single solid wire with a diameter of 0.063". Alternatively, the conductor 310 can be provided by multiple stranded wires. In some implementations, the conductor contains 3 parallel 0.032" stranded wires. Multiple stranded wires can reduce RF power losses through skin effect. In some implementations, the conductor 310 is formed from Litz wires, which can further reduce skin effect.

A material with high electrical conductivity, e.g., above $10^7$ Siemen/m, is used, which can reduce resistive power losses. In some implementations, the conductor 310 is made of copper or an alloy of copper. In some implementations, the conductor is made of aluminum.

Undesired material sputtering or etching can lead to process contamination or particle formation. Whether the intra chamber electrode assembly 120 is used as a CCP or an ICP source, undesired sputtering or etching can occur. The undesired sputtering or etching may be caused by excessive ion energy at the electrode surface. When operating as a CCP source, an oscillating electric field around the cylindrical shell is necessary to drive the plasma discharge. This oscillation leads to sputtering or etching of materials, as all known materials have a sputtering energy threshold that is lower than the corresponding minimum operating voltage of a CCP source. When operated as an ICP source, capacitive coupling of the filament 300 to the plasma creates an oscillating electric field at nearby surfaces, which also causes sputtering of materials. The problems resulting from undesired material sputtering or etching may be mitigated by using a process-compatible material for the outer surface of the filament 300 exposed to the interior space 104 (e.g., the cylindrical shell 320).

In some implementations, the cylindrical shell 320 is formed of a process-compatible material such as silicon, e.g., a high resistivity silicon, an oxide material, a nitride material, a carbide material, a ceramic material, or a combination thereof. Examples of oxide materials include silicon dioxide (e.g., silica, quartz) and aluminum oxide (e.g., sapphire). Examples of carbide materials include silicon carbide. Ceramic materials or sapphire may be desirable for some chemical environments including fluorine-containing environments or fluorocarbon containing environments. In chemical environments containing ammonia, dichlorosilane, nitrogen, and oxygen, use of silicon, silicon carbide, or quartz may be desirable.

In some implementations, the cylindrical shell 320 has a thickness of 0.1 mm to 3 mm, e.g., 2 mm.

In some implementations, a fluid is provided in the channel 330. In some implementations, the fluid is a non-oxidizing gas to purge oxygen to mitigate oxidization of the conductor 310. Examples of non-oxidizing gases are nitrogen and argon. In some implementations, the non-oxidizing gas is continuously flowed through the channel 330, e.g., by the fluid supply 146, to remove residual oxygen or water vapor.

The heating of conductor 310 can make the conductor more susceptible to oxidization. The fluid can provide cooling to the conductor 310, which may heat up from supplied RF power. In some implementations, the fluid is circulated through the channel 330, e.g., by the fluid supply 146, to provide forced convection temperature control, e.g., cooling or heating.

In some implementations, the fluid may be near or above atmospheric pressure to prevent breakdown of the fluid. For example, gas breakdown or unwanted plasma formation in tube may be prevented by providing fluid pressure above 100 Torr.

Referring to FIG. 3B, in some implementations of the filament 300, the conductor 310 has a coating 320. In some implementations, the coating 320 is an oxide of the material forming the conductor (e.g., aluminum oxide on an aluminum conductor). In some implementations, the coating 320 is silicon dioxide. In some implementations, the coating 320 is formed in-situ in the plasma reactor of the processing tool 100 by, for example, a reaction of silane, hydrogen, and oxygen to form a silicon dioxide coating. In-situ coating may be beneficial as it can be replenished when etched or sputtered. In-situ coating can have a range of thicknesses, ranging from 100 nm to 10 μm.

Referring to FIG. 3C, in some implementations of the filament 300, the conductor 310 is hollow, and a hollow channel 340 is formed inside the conductor 310. In some implementations, the hollow channel 340 can carry a fluid as described in FIG. 3A. A coating of the process-compatible material can cover the conductor 310 to provide the cylindrical shell 320. In some implementations, the coating 320 is an oxide of the material forming the conductor (e.g., aluminum oxide on an aluminum conductor). In some implementations, the hollow conductor 310 has an outer diameter of 2 mm, with a wall thickness of 0.5 mm.

Figure 4A:
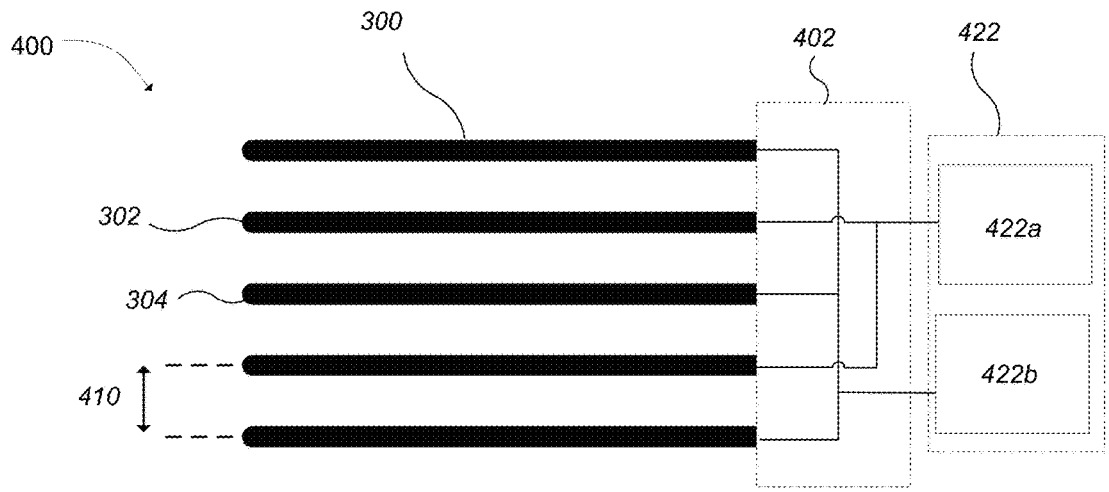
FIG. 4A is a schematic top view diagram of a portion of an intra-chamber electrode assembly.

FIG. 4A is a schematic diagram of a portion of an intra-chamber electrode assembly. An intra-chamber electrode assembly 400 includes multiple coplanar filaments 300 attached at a support 402. An electrode array is formed by the multiple coplanar filaments 300. The electrode assembly 400 can provide the electrode assembly 120. In some implementations, at least over the region corresponding to where the workpiece is processed, the filaments 300 extend in parallel to each other.

The filaments 300 are separated from one another by a filament spacing 410. The spacing 410 can impact plasma uniformity. If the spacing is too large, then the filaments can create shadowing and non-uniformity. On the other hand, if the spacing is too small, the plasma cannot migrate between the top gap 130 and the bottom gap 132, and non-uniformity will be increased or free radical density will be reduced.

In general, a desired value for filament spacing 410 is dependent on several factors. Examples of such factors include chamber pressure, RF power, distance between the filament 300 to the workpiece 115, and process gas composition. For example, when operating at lower pressure, e.g., below 2 Torr, and with large distance between the filament and the workpiece, e.g., greater than 3 mm, the filament spacing 410 may be increased.

In some implementations, the filament spacing 410 is uniform across the assembly 400. The filament spacing 410 can range from 3 mm to 20 mm, e.g., 8 mm.

Figure 4B:
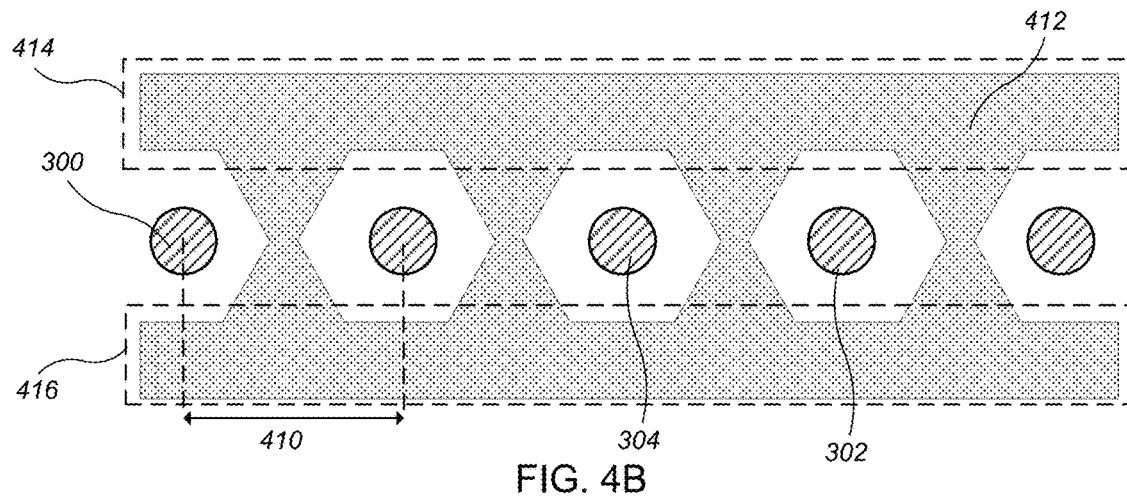
FIGS. 4B-C are cross-sectional schematic side view diagrams of an intra-chamber electrode assembly with different plasma region states.
Figure 4C:
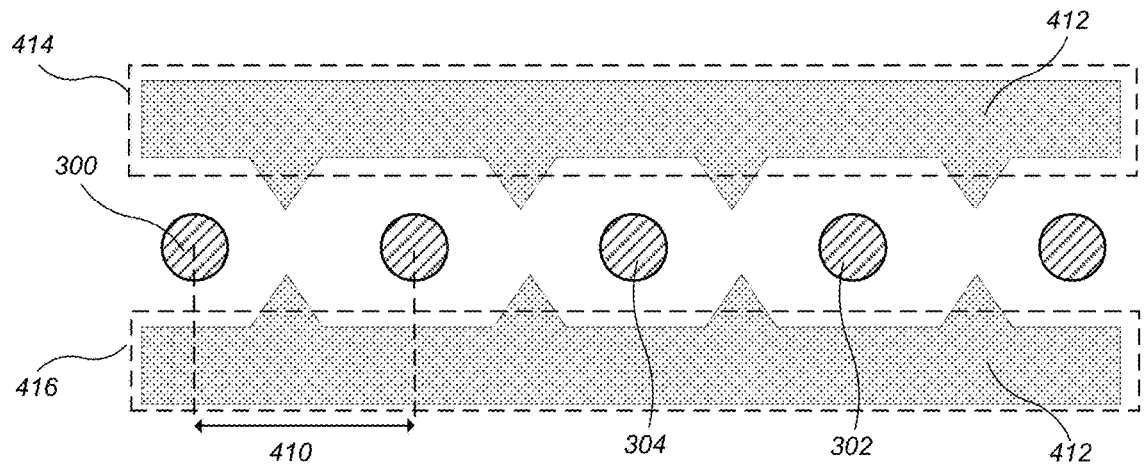

FIGS. 4B-C are cross-sectional schematic diagrams of an intra-chamber electrode assembly with different plasma region states. Referring to FIG. 4B, in some operating conditions, a plasma region 412 surrounds the filaments 300. Examples of such operating conditions can include all filaments being driven with the same RF signal (i.e., "monopolar"), with a grounded top electrode. The plasma region 412 has an upper plasma region 414 and a lower plasma region 416. The upper plasma region 414 can be located at the top gap 130 and the lower plasma region 416 can be located at the bottom gap 132. As shown in FIG. 4B, the upper plasma region 414 and the lower plasma region 416 is connected through the gaps between the filaments 300, forming a continuous plasma region 412. This continuity of the plasma regions 412 is desirable, as the regions 414 and 416 'communicate' with each other through exchange of plasma. The exchanging of plasma helps keep the two regions electrically balanced, aiding plasma stability and repeatability.

Referring to FIG. 4C, in this state, the upper plasma region 414 and the lower plasma region 416 is not connected to each other. This 'pinching' of the plasma region 412 is not desirable for plasma stability. The shape of the plasma region 412 can be modified by various factors to remove the plasma region discontinuity or improve plasma uniformity.

In general, the regions 412, 414, and 416 can have a wide range of plasma densities, and are not necessarily uniform. Furthermore, the discontinuities between the upper plasma region 414 and the lower plasma region 416 shown in FIG. 4C represents a substantially low plasma density relative to the two regions, and not necessarily a complete lack of plasma in the gaps.

In some operating conditions, e.g., top electrode is absent or floating, and the workpiece support electrode is grounded, plasma region 414 may not be formed, or have low plasma density.

In some implementations, the intra-chamber electrode assembly 400 can include a first group and a second group of filaments 300. The first group and the second group can be spatially arranged such that the filaments alternate between the first group and the second group. For example, the first group can include the filament 302, the second group can include the filaments 300 and 304. The first group can be driven by a first terminal 422a of an RF power supply 422 and the second group can be driven by a second terminal 422b of the RF power supply 422. The RF power supply 422 can be configured to provide a first RF signal at the terminal 422a and a second RF signal at terminal 422b. The first and second RF signals can have a same frequency and a stable phase relationship to each other. For example, the phase difference between the first and second RF signals can be 0 or 180 degrees. In some implementations, the phase relationship between the first and the second RF signals provided by the RF power supply 422 can be tunable between 0 and 360. In some implementations, the RF supply 422 can include two individual RF power supplies that are phase-locked to each other.

In some operating conditions, e.g., when the phase difference between the first and second RF signals is 180, the resulting plasma region may be concentrated between the filaments.

The top gap 130 is a factor affecting the shape of the plasma region. When the top electrode 108 is grounded, reducing the top gap 130 typically leads to a reduction of plasma density in the upper plasma region 414. Specific values for the top gap 130 can be determined based on computer modelling of the plasma chamber. For example, the top gap 130 can be 3 mm to 8 mm, e.g., 4.5 mm.

The bottom gap 132 is a factor affecting the shape of the plasma region. When the workpiece support electrode 116 is grounded, reducing the bottom gap 132 typically leads to a reduction of plasma density in the lower plasma region 416. Specific values for the bottom gap 132 can be determined based on computer modelling of the plasma chamber. For example, the bottom gap 132 can be 3 mm to 9 mm, e.g., 4.5 mm.

In general, the chamber pressure is a factor affecting the shape of the plasma region.

Figure 5:
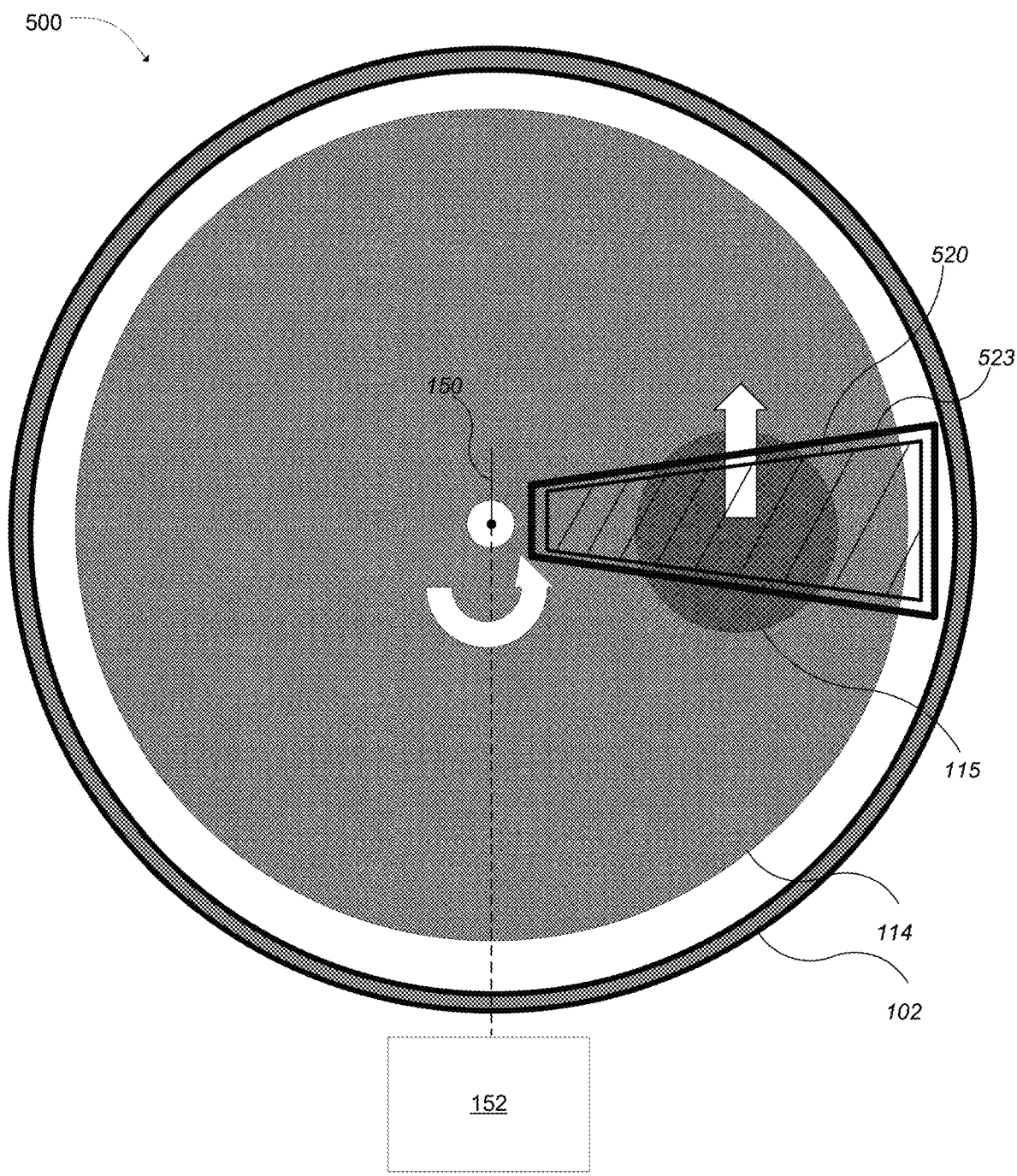
FIG. 5 is a schematic top view diagram of an example of a processing tool.

FIG. 5 is a schematic top view diagram of the interior region of an example of the processing tool. In a processing tool 500, the workpiece support 114 is rotating about the axis 150, and the rotation of the workpiece support 114 causes the workpiece 115 to move under an electrode assembly 520, through the plasma region generated by the electrode assembly 520. The processing tool 500 is similar to the processing tool 200, and the electrode assembly 520 is similar to the electrode assembly 400, except as described.

When the workpiece 115 rotates through the plasma region around the axis 150, velocities experienced by different surface regions of the workpiece varies as a function of their radial distance from the axis 150. For example, a regions of the workpiece further away from the axis 150 moves faster than a region closer to the axis 150. For a rectangular or linear plasma region, the regions of the workpiece that are further away from the axis 150 experiences a correspondingly shorter dwell time in the plasma region. This radial non-uniformity in dwell time leads to a non-uniformity in received plasma dose across the workpiece, resulting in undesirable process non-uniformities.

One method of compensating for the foregoing dwell time non-uniformity is to vary the local density of the plasma region in proportion to the local velocity of the wafer. For example, the local plasma density can be increased in proportion to the radial distance from the axis 150. By increasing the plasma density at the regions of higher local velocity, those regions receive an equal dose of plasma integrated over their respective shorter dwell times. However, spatial non-uniformity in plasma density can lead to non-uniform charging of the workpiece surface, generating an electric potential difference across the workpiece surface. Depending on the die size and device sensitivity, sufficiently large electric potential difference across the surface (e.g., greater than 2 volts, 5 volts, 10 volts, 15 volts, 25 volts) can lead to damages to devices being fabricated on the workpiece, e.g., dielectric breakdown of thin transistor gate dielectric layer.

Another way of compensating for the dwell time non-uniformity is by modifying the geometry of the plasma region. The plasma region geometry can be modified such that regions of higher local velocity travel through correspondingly longer sections of the plasma region to equalize dwell times of different regions of the workpiece surface. For the configuration shown in FIG. 5, dwell time equalization can be achieved with a wedge-shaped plasma region. In such a configuration, the radial increase in local velocity by moving away from the axis 150 can be canceled out by a proportional increase in the arc length of the wedge-shaped plasma region over the respective regions.

The foregoing wedge-shaped plasma region can be formed by configuring the coplanar filaments of the electrode assembly 520 and an opening 523 in various ways. One way is to configure an electrode array formed by the filaments of the electrode assembly 520 in the shaped of a wedge. For example, the respective lengths of the individual coplanar filaments of the electrode array can be modified so that an overall contour of the electrode array defines a wedge. In some implementations, the support 206 can provide support at the respective two ends of the coplanar filaments of the electrode array.

Another way to form the wedge-shaped plasma region is by forming the opening 523 to have the wedge shape and forming a plasma region larger than the size of the opening 523 using the electrode array of the electrode assembly 520 that is larger than the opening 523 (e.g., electrode assembly 400). Then, portions of the generated plasma region can be blocked by the wedge-shaped opening to generate the wedge-shaped plasma region. For example, the support 206 can provide the wedge-shaped opening 523.

In general, various factors can affect the sizing of the wedge-shaped plasma region. In some applications, partial or incomplete plasma coverage over the surface of the workpiece can lead to detrimental results. For example, workpiece 115 can contain devices sensitive to charging damage, e.g., transistors with thin gate dielectric layer. In such cases, the electric potential developed between a region of workpiece 115 exposed to the plasma and a region unexposed to the plasma can lead to dielectric breakdown of the gate dielectric layers, resulting in permanent damage of the sensitive devices. Such problem can be mitigated by sizing the plasma region to be larger than the workpiece to achieve complete plasma coverage over the entire workpiece surface. In some implementations, the plasma region is sized to enable movement of the workpiece through the plasma region while maintaining complete plasma coverage.

In some implementations, e.g., with the plasma region larger than the workpiece, the timing of the application of RF power to the electrode assembly 520 can be coordinated with the movement of the workpiece 115 to ensure that the entire surface of the workpiece experience is uniformly exposed to the plasma. For example, the plasma can be generated (ignited) after the entire workpiece moves under the opening 523 or the electrode assembly 520, and turned off (extinguished) before the workpiece leaves the plasma region. In this case, the plasma region need not be wedge-shaped.

In some cases, however, creating a large plasma region (e.g., larger than 300 mm×300 mm) using the electrode assembly 520 can be challenging. If the workpiece to be processed can withstand an incomplete plasma coverage over its surface, the plasma region can be sized to be smaller than the workpiece surface in one direction of the workpiece. For example, as shown in FIG. 5, the wedge-shaped electrode assembly 520 (and hence the plasma region) is smaller than the workpiece diameter in the direction of travel of the workpiece 115, but is larger than the workpiece diameter along the radial direction with respect to the axis 150 to achieve complete coverage in the radial direction.

Other considerations for sizing of the plasma region include workpiece movement speed, target processing rate, and target plasma exposure time to achieve desired process duration or throughput.

In some implementations, the plasma can be coordinated with the movement of the workpiece to ensure that a stable plasma is established before the workpiece enters the plasma region. For example, in processes requiring relatively short plasma exposure time, the time spent in striking on of the plasma can be a significant portion of the entire plasma exposure time. Because the plasma is relatively unstable during the striking phase, the resulting process repeatability may suffer. By establishing a stable plasma before introducing the workpiece, the plasma exposure time and dose can be precisely controlled by controlling the speed of the workpiece as it moves through the plasma region. For such implementations, regardless of whether the plasma region is larger or smaller than the workpiece, it is advantageous for the plasma region to be wedge-shaped to compensate for differences in exposure time. In some implementations, the generated plasma is maintained over processing of multiple workpieces.

Given the processing tool 500 having a fixed plasma region size, various process parameters can be controlled to achieve desired plasma processing characteristics. Examples of the process parameters that can be controlled include processing rate, exposure time, workpiece movement speed profile, number of plasma exposure passes, and total plasma exposure dose. For example, the workpiece may make multiple passes through the plasma region, or may oscillate in position within the plasma region.

Figure 6A:
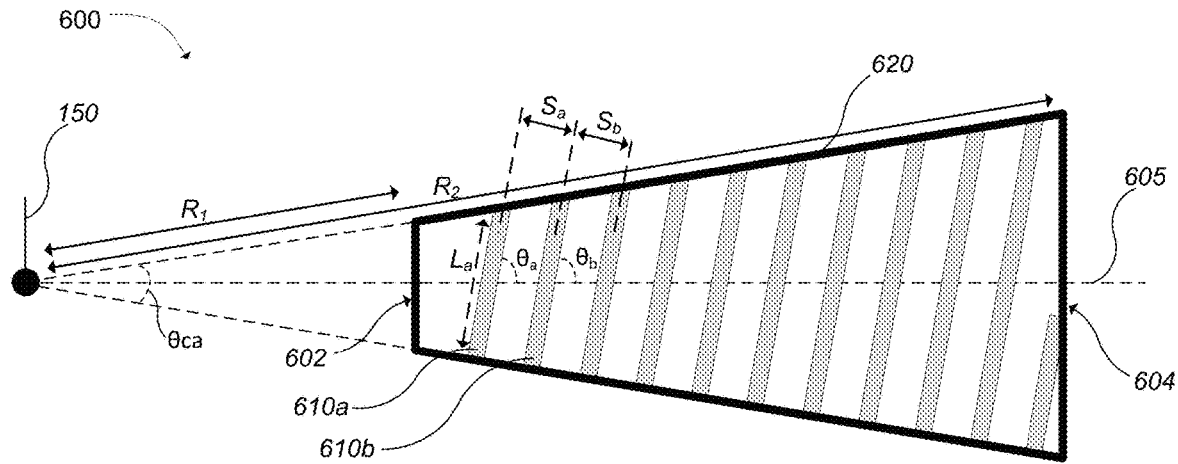
FIG. 6A is a schematic top view diagram of an example of a wedge-shaped electrode assembly.

FIG. 6A is a schematic top view diagram of an example of a wedge-shaped electrode assembly for generating a wedge-shaped plasma region. A wedge-shaped electrode assembly 600 has multiple coplanar filaments 610 and a frame 620. The electrode assembly 600 is similar to the electrode assembly 120, 220 and 400, except as described. The frame 620 has a first end 602, a second end 604, a central angle θca, an inner radius $R_1$, an outer radius $R_2$, and a bisector 605. The first end 602 is the short end of the electrode assembly 600, sometimes called an apex. The second end 604 is the longer end of the electrode assembly 600, sometime called a base. The multiple coplanar filaments 610 are similar to the filaments 300, except as described. Each coplanar filament 610 has a respective length L, respective angle θ (theta) with respect to the bisector 605. Length L is defined to be a linear portion of the coplanar filaments 610 in a region parallel and adjacent to the workpiece support surface, e.g., 114a. Each adjacent pair of coplanar filaments 610 are separated by respective separations S, defined as the center-to-center distance between the adjacent filaments. For non-parallel filaments, the separation S is defined as the smallest center-to-center spacing along the lengths of the adjacent filament pair.

There are various considerations for determining angle theta of the filaments 610. One consideration for determining the angle theta is the trajectory of workpiece 115 as it moves under the electrode assembly 600. In some situations, the plasma generated by the electrode assembly 600 can have non-uniformities in plasma that extend along the direction of the filaments 610. For example, an elongated region of reduced plasma density may exist between a pair of filaments 610 in certain operating conditions. If a point on the surface of the workpiece travels along such region of reduced plasma density, the point will receive reduced plasma exposure dose, resulting in process non-uniformity. By arranging the filaments to have an appropriate value of theta (e.g., smaller or larger than 90°, excluding) 90°, such tangential travel along regions of reduced plasma density can be reduced, improving process uniformity. For example, by setting the theta to 60°, points on the surface of the workpiece pass under multiple filaments, being exposed to local plasma regions having reduced density as well as nominal density along the way, resulting in time-averaging of the plasma exposure dose. In some implementations, the respective theta of the multiple coplanar filaments 610 are equal, i.e., the filaments are parallel.

In some implementations, the respective theta of the filaments 610 are different based on their respective locations within the electrode assembly 600. For example, the respective theta monotonically increases for filaments near the apex 602 to filaments near the base 604 of the assembly 600 to maintain equal lengths of the filaments 610 across the electrode assembly 600. Having filaments of equal lengths may improve uniformity when the assembly 600 is operated as an ICP source.

In general, the number of coplanar filaments 610 is determined by the size of the plasma region, the theta, and the separation S to achieve desired plasma region characteristics, e.g., plasma density, uniformity.

In general, the separation S can be determined based on considerations discussed in FIG. 4 regarding the filament spacing 410.

The frame 620 defines the shapes of electrode assembly 600 and the shape of the plasma region formed by the electrode assembly 600. The inner radius, the outer radius and the central angle determines the size of the wedge-shaped electrode, which in turn defines the size of the plasma region. The size of the frame can be determined based on foregoing discussion of plasma region sizing in relation to FIG. 5.

The frame 620 can be formed of different process-compatible materials. Suitable process-compatible materials include those described in relation to cylindrical shell 320 e.g., quartz. Other examples of process-compatible materials include ceramics (e.g., Aluminum Oxide, Aluminum Nitride), and various nitrides of silicon (e.g., SiN, $Si_3N_4$).

While frame 620 has been described in relation to the wedge-shaped electrode assembly 600, the filaments 610 can be formed and arranged to have the described wedge shape without the frame 620 to achieve similar results.

An example of the wedge-shaped electrode assembly has the following design properties: $R_1$=91 mm, $R_2$=427 mm, central angle=31°, theta=60°, filament center-to-center separation=15 mm, number of filaments=20, frame material=quartz.

Figure 6B:
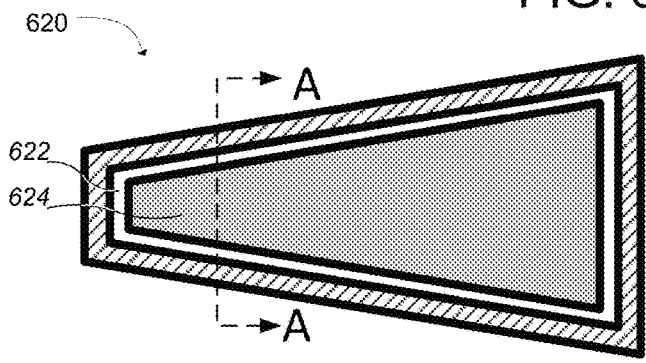
FIG. 6B is a schematic top view diagram of an example of a frame of a wedge-shaped electrode assembly.

Referring to FIG. 6B, in some implementations, the frame 620 has a cutout 622. The cutout 622 can be shaped to fit a wedge-shaped top electrode 624. The wedge-shaped top electrode 624 can be grounded or biased to a bias voltage. The wedge-shaped top electrode 624 can be formed of various process compatible materials, e.g., silicon. In some implementations, the wedge-shaped electrode is shaped to be inserted into the cutout 622 to fill the cutout 622.

Figure 6C:
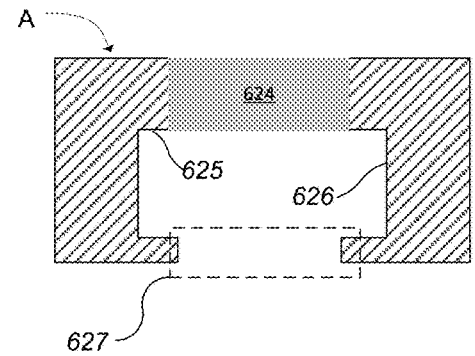
FIG. 6C is a cross sectional side view diagram of an example of a frame of a wedge shaped electrode assembly.

Referring to FIG. 6C, a cross sectional view of a portion of the frame 620 along a cross section line A is illustrated. In some implementations, the frame has an upper portion 625, an inner sidewall 626, and an opening 627.

In general, the respective lengths L of the multiple coplanar filaments 610 are set to generate a plasma region of desired shape. The frame 620 can be shaped to provide support to the coplanar filaments 610. In some implementations, the ends of the coplanar filaments 610 are supported by the inner sidewall 626 of the frame 620, similar to the configuration shown in FIG. 6A. In some implementations, the ends of the coplanar filaments 610 are bent (e.g. 90°) to be supported by the upper portion 625 of the frame 620, as shown in the electrode assembly 220a of FIG. 2B. In some implementations, the opening 627 of the frame 620 can determine the shape of the plasma region.

Figure 6D:
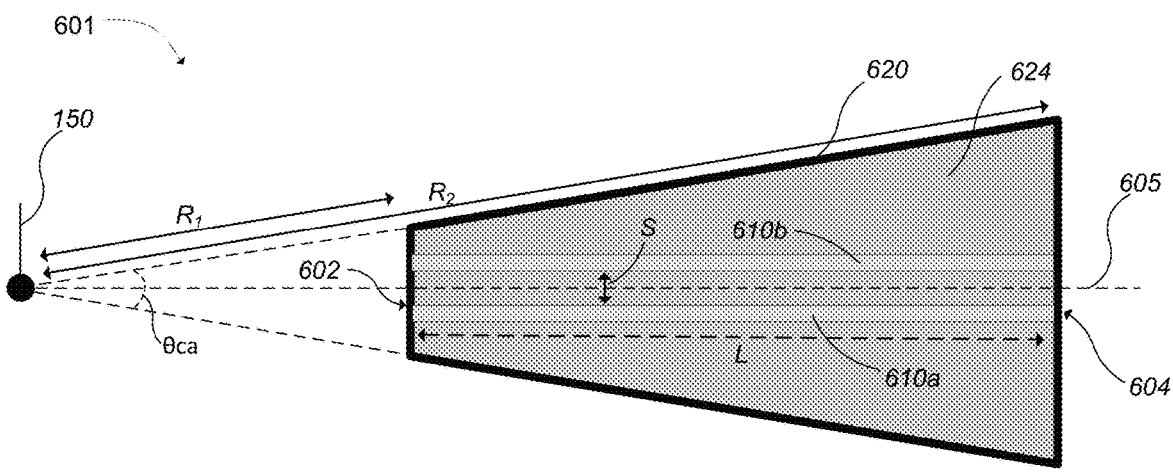
FIG. 6D is a schematic top view diagram of an example of a wedge-shaped electrode assembly.

In some implementations, the theta is close to 0, e.g., <20°. Referring to FIG. 6D, the assembly 601 has two filaments, and the filaments are arranged with theta=0°, i.e., the filaments are parallel to the bisector 605. The frame 620 of the assembly 601 has the cutout 622, and the wedge-shaped electrode 624. The wedge-shaped electrode 624 can be grounded. In such a configuration, the shaped of the plasma region generated by the electrode assembly 601 is affected by the interaction between the filaments 610 and the wedge-shaped electrode 624, resulting in a wedge-shaped plasma region. In configuration where theta is close to 0°, the effects of plasma non-uniformity parallel to the filament 610 can be reduced as the direction of travel of the workpiece 115 is substantially close to 90° with respect to the orientation of the filaments 610.

Figure 7A:
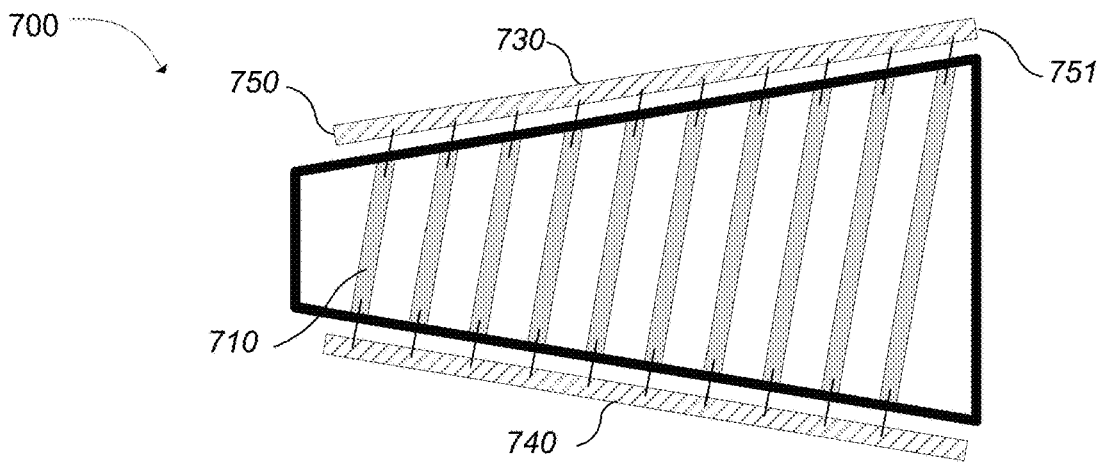
FIGS. 7A-7D are conceptual schematic diagrams of various electrical configurations of a wedge-shaped electrode assembly.

FIGS. 7A-7D are conceptual schematic diagrams of various electrical configurations of a wedge-shaped electrode assembly. The filaments of the electrode assembly can be electrically connected in various different configurations. Referring to FIG. 7A, an electrode assembly 700 similar to the electrode assembly 600, and has a first bus 730 and a second bus 740. The first bus 730 and the second bus 740 can be located on opposite sides of the chamber body 102, e.g., outside the chamber.

The first bus 730 has a first end 750 and a second end 751 opposite to the first end 750. The first bus 730 and the second bus 740 are electrically connected to the respective opposite ends of each filament 710 of the electrode assembly 700. The filament 710 is similar to the filament 300, except as described. The electrode assembly 700 can be driven in various ways using one or more RF power sources.

In some implementations, a first RF power source drives the first bus 730, and the second bus 740 is connected to an RF ground. In such a configuration, RF current flows across the filaments 710, and the electrode assembly may work as a predominantly ICP plasma source.

In some implementations, the first RF power source drives the first bus 730, and the second bus 740 is electrically floating. In such a configuration, the electrode assembly may work as a predominantly CCP plasma source. The RF current return path may be provided by the chamber body 102, top electrode 108, the wedge-shaped top electrode 624, or by the workpiece support electrode 116.

In some implementations, the first RF power source drives the first bus 730 at the first end 750, a second RF power source drives the first bus 730 at the second end 751, and the second bus 740 is connected to an RF ground. In such a configuration, the electrode assembly may work as a predominantly ICP plasma source.

In some implementations, the first RF power source drives the first bus 730, and the second RF power source drives the second bus 740.

In general, a RF driving point at which the RF power source connects to a bus is selected to optimized uniformity of the resulting plasma. For example, the driving point location can be selected based on minimizing non-uniformity in RF signal amplitude experienced by individual filaments 710.

In some implementations, the intra-chamber electrode assembly can include a first group and a second group of coplanar filaments. The filaments of the first group and the second group can be arranged in an alternating pattern along the direction perpendicular to their longitudinal axis. As such, that the coplanar filaments alternate between the first group and the second group.

Figure 7B:
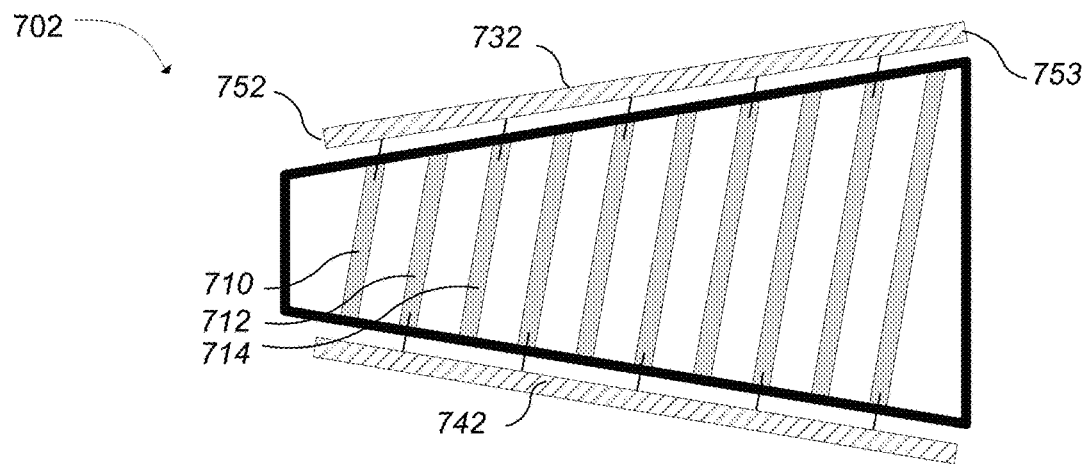

Referring to FIG. 7B, an electrode assembly 702 similar to the electrode assembly 600 has a first group can include the coplanar filaments 710 and 714, and a second group that include the coplanar filaments 712. The first group is electrically connected to a first bus 732, and the second group is electrically connected to a second bus 742. An end of each filament farther from the bus to which it is connected can be "floating" or grounded. If the ends of the filaments are floating, the two groups of filaments can be considered to form an interdigited array.

The first bus 732 can have a first end 752 and a second end 753 opposite to the first end 752. In some implementations, the first RF power source drives the first bus 732 with a first RF signal, and the second RF power source drives the second bus 742 with a second RF signal. The first and second RF signals may have the same frequency and a stable phase relationship to each other. For example, the phase difference between the first RF signal and the second RF signal can be 0 degrees or 180 degrees. In some implementations, the phase relationship between the first and the second RF signals provided by the RF power supply 422 can be tunable between 0 and 360. In some implementations, the RF supply 422 can include two individual RF power supplies 422a and 422b that are phase-locked to each other.

In some implementations, the first RF power source drives the first bus 732, and the second bus 742 is connected to an RF ground. In such cases, the second bus 742 and the even group of filaments connected to the second bus 742 can serve as an RF current return path.

In some implementations, the first RF power source drives the first bus 732 at the first end 752, and a second RF power source drives the first bus 732 at the second end 753, and the second bus 742 is connected to an RF ground.

In some implementations, the first RF power source drives the first bus 732, and the second RF power source drives the second bus 742. In such cases, the electrode assembly 702 may work as a predominantly CCP plasma source. The RF current return path may be provided by the chamber body 102, the top electrode 108, the wedge-shaped top electrode 624, or by the workpiece support electrode 116.

Figure 7C:
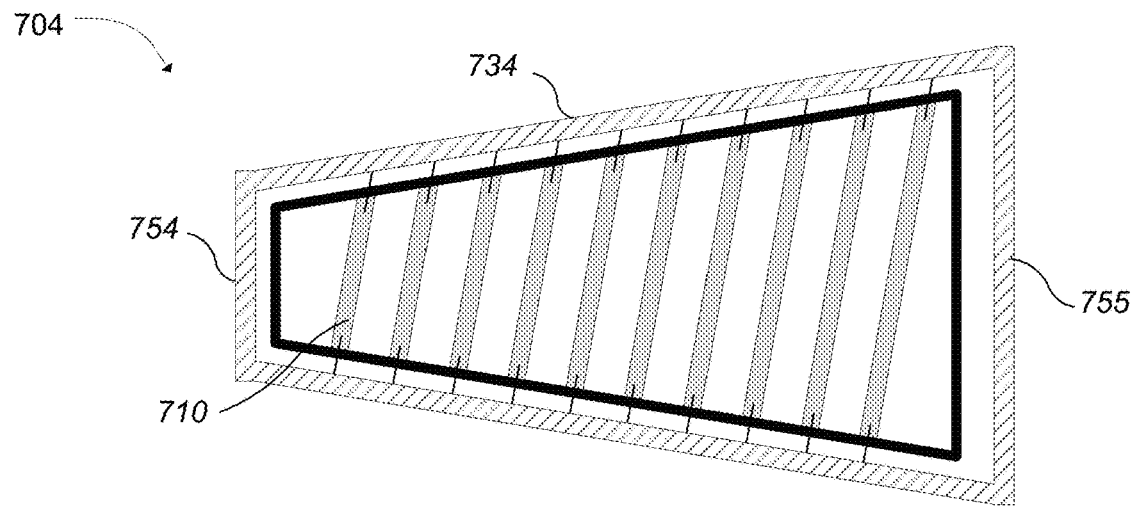

Referring to FIG. 7C, an electrode assembly 704 similar to the electrode assembly 600 has a single bus 734. The bus 734 is electrically connected to the both ends of the filaments 710.

In some implementations, the first RF power source drives the first bus 734. The first bus 734 can have a first end 754 and a second end 755, and in some implementations, the first RF power source drives the first bus 734 at the first end 754, and the second RF power source drives the first bus 734 at the second end 755. In such a configuration, the electrode assembly may work as a predominantly CCP plasma source. The RF current return path may be provided by the chamber body 102, the top electrode 108, the wedge-shaped top electrode 624, or by the workpiece support electrode 116.

Figure 7D:
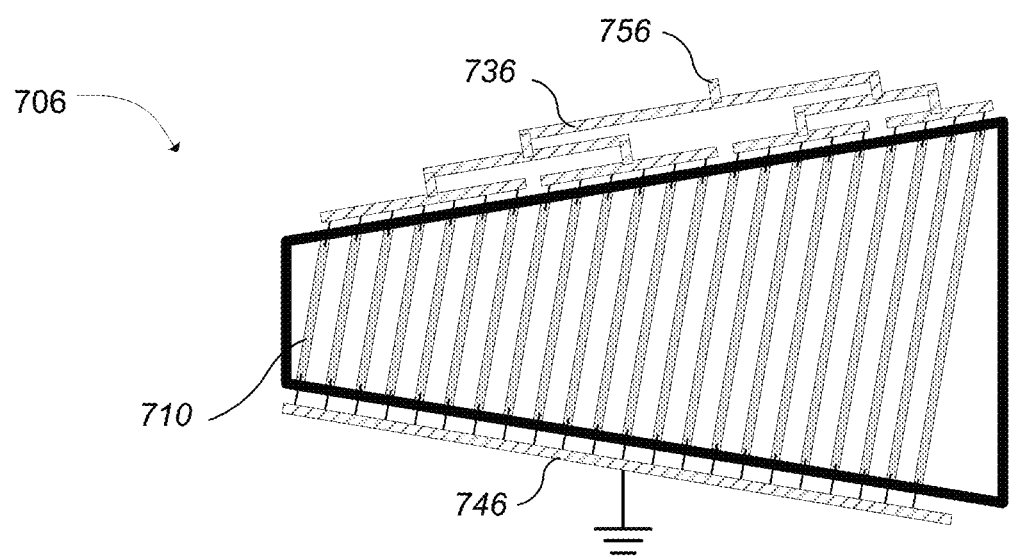

Referring to FIG. 7D, an electrode assembly 706 similar to the electrode assembly 600 has a first bus 736 and a second bus 746. The first bus 736 and the second bus 746 are electrically connected to the respective opposite ends of filaments 710 of the electrode assembly 706. The first RF power source drives the first bus 736 at a driving point 756. The second bus 746 can be connected to an RF ground.

The first RF signal generated by the first RF power source may be attenuated by various sources of RF loss. For example, an RF transmission line that forms the bus 736 is lossy due to finite electrical conductivity of the conductor, or dielectric loss tangent due to a dielectric material forming the transmission line. As another example, the plasma loading of the RF transmission line affects RF losses. Therefore, filaments 710 connected at different locations along the direction of propagation of the RF signal may experience different RF signal amplitude. For example, referring to FIG. 7A, an RF signal launched at the first end 750 will be attenuated as it propagates down the length of the first bus 730. As a result, the RF signal amplitude at the filaments 710 near the second end 751 will be smaller than the RF signal amplitude at the filaments 710 near the first end 750, where the RF signal is being launched.

Standing waves resulting from reflections of RF signals due to imperfect RF impedance matching/termination can also create non-uniformities in RF signal amplitude along the length of the first bus 730. For example, an RF signal launched at the first end 750, upon reaching the second end 751, may get reflected back towards the first end 750 due to a lack of impedance matched termination, creating a standing wave along the length of the first bus 730.

Such non-uniformity in RF signal amplitude across the length of the first bus 730 may result in plasma non-uniformity.

Non-uniformity in RF signal amplitude across the first bus 730 can be reduced by using a recursive RF feed structure. Referring back to FIG. 7D, the first bus 736 is configured to form a recursive RF feed structure to deliver the first RF signal generated by the first RF power source to the filaments 710 such that the signal path lengths, and hence the loss experienced by the RF signal, from the driving point 756 to each filaments 710 is approximately equal for all filaments 710. Such approximately equal path lengths can enable approximately equal RF signal amplitudes at the driven ends (i.e., ends connected to the first bus 736) of the filament 710. In some implementations, the non-uniformity in RF signal amplitude is further mitigated by configuring the recursive RF feed structure such that each branch of the structure is connected to an approximately equal total length of filaments. For example, from left to right, 7, 6, 5, 4 filaments, respectively, are connected to the respective branch of the recursive RF feed structure. Such approximately equal total lengths per branch may help improve uniformity when the electrode assembly 706 is operated as an ICP source. In some implementations, each level of recursion of the feed structure is shielded by respective ground planes, and a vertical via penetrating the ground plane connected the respective levels of the structure.

In cases where the electrode assembly is driven by two RF signal sources, various factors affects the shape of the generated plasma region. Examples of factors include the frequency and the phase relation of the two RF signals. Referring to FIG. 7B, for example, when the frequency of the first and second RF signals driving the first bus 732 and the second bus 742 is the same and the phase difference is set to 0 degrees ('monopolar', or 'singled-ended'), the plasma region is pushed out from the gaps between the coplanar filaments 710, leading to discontinuity or non-uniformity. When the phase difference of the RF signals driving the adjacent coplanar filaments 710 is set to 180 degrees ('differential'), the plasma region is more strongly confined between the coplanar filaments 710. Any phase difference between 0 and 360 degrees can be used to affect the shape of the plasma region.

In general, the grounding of the workpiece support electrode 116 is a factor affecting the shape of the plasma region. Imperfect RF grounding of the electrode 116 in combination with 0 degrees of phase difference between the RF signals driving the adjacent coplanar filaments pushes the plasma region towards the top gap. However, if adjacent coplanar filaments, e.g., coplanar filaments are driven with RF signals that have 180 degrees of phase difference, the resulting plasma distribution is much less sensitive to imperfect RF grounding of the electrode 116. Without being limited to any particular theory, this can be because the RF current is returned through the adjacent electrodes due to the differential nature of the driving signals.

Particular embodiments of the invention have been described. Other embodiments are within the scope of the following claims.

What is claimed is:

1. A processing tool for a plasma process, the processing tool comprising:
a chamber body having an interior space that provides a plasma chamber;
a frame having an upper portion, sidewalls extending downward from the upper portion, and a floor extending inward from the sidewalls, the floor having an opening therethrough to the plasma chamber, wherein the opening is wedge-shaped and a width of the opening is less than a width of an interior volume of the frame between the sidewalls;
an electrode assembly held by the frame, the electrode assembly comprising a plurality of coplanar filaments extending laterally through the interior volume of the frame and between the sidewalls and above the opening, each of the plurality of filaments including a conductor, wherein the plurality of filaments are oriented at a different angle with respect to a midline of the opening, and wherein the different angles vary monotonically in the wedge-shaped opening from an apex of the wedge-shaped opening to a base of the wedge-shaped opening such that each of the plurality of filaments is equal in length across the wedge-shaped opening;
a workpiece support to hold a workpiece in the plasma chamber such that at least a portion of a front surface of the workpiece faces the opening in the floor of the frame;
an actuator to generate relative motion between the chamber body and the workpiece support such that the opening moves laterally across the workpiece;
a gas distributor to deliver a processing gas to the plasma chamber; and
a first RF power source to supply a first RF power to the conductors of the electrode assembly to form a plasma.

2. The processing tool of claim 1, wherein the workpiece support is rotatable about an axis of rotation and the actuator rotates the workpiece support such that rotation of the support carries the workpiece across the opening.

3. The processing tool of claim 2, wherein the plurality of coplanar filaments extend across the wedge-shaped opening.

4. The processing tool of claim 3, wherein the plurality of coplanar filaments comprise linear filaments, and different filaments have different lengths so as to define the wedge-shaped opening.

5. The processing tool of claim 4, wherein the plurality of coplanar filaments extend in parallel.

6. The processing tool of claim 4, wherein the plurality of coplanar filaments are uniformly spaced apart.

7. The processing tool of claim 3, wherein the plurality of coplanar filaments are oriented to have longitudinal axes at a non-zero angle relative to a direction of motion of the workpiece below the opening.

8. The processing tool of claim 7, wherein the non-zero angle is greater than 10°.

9. The processing tool of claim 1, wherein the different angles provide a relative orientation of the plurality of coplanar filaments such that a plasma density generated in the wedge-shaped opening is lower at the apex of the wedge-shaped opening than at the base of the wedge-shaped opening.

10. The processing tool of claim 1, further comprising a top electrode on the upper portion of the chamber.

11. The processing tool of claim 1, wherein ends of conductors of the plurality of coplanar filaments are connected to the first RF power source by a recursive RF feed structure.

12. The processing tool of claim 1, wherein opposite ends of conductors of the plurality of coplanar filaments are connected to a common bus, and the bus is connected to the first RF power source at two opposing locations.

13. The processing tool of claim 1, wherein a first multiplicity of conductors of the plurality of coplanar filaments are connected to the first RF power source and a second multiplicity of conductors of the plurality of coplanar filaments are floating or are grounded or are connected to a second RF power source.

14. The processing tool of claim 13, wherein ends of the first multiplicity of conductors of the plurality of coplanar filaments are connected to the first RF power source by a common bus.

15. The processing tool of claim 13, wherein the first multiplicity of conductors and the second multiplicity of conductors are arranged to alternate along a direction perpendicular to a longitudinal axis of the filaments.

* * * * *